United States Patent
Ilchenko et al.

(10) Patent No.: US 7,218,662 B1
(45) Date of Patent: May 15, 2007

(54) COUPLED OPTO-ELECTRONIC OSCILLATORS WITH LOW NOISE

(75) Inventors: Vladimir Ilchenko, Arcadia, CA (US); Ismail Tolga Yilmaz, Orlando, FL (US); Nikolai Morozov, Valley Village, CA (US); Dmitri A. Kossakovski, S. Pasadena, CA (US); Danny Eliyahu, Pasadena, CA (US); Mark Henderson, La Verne, CA (US)

(73) Assignee: OEWaves, Inc., Pasadena, CA (US)

( * ) Notice: Subject to any disclaimer, the term of this patent is extended or adjusted under 35 U.S.C. 154(b) by 300 days.

(21) Appl. No.: 11/058,397

(22) Filed: Feb. 14, 2005

Related U.S. Application Data

(60) Provisional application No. 60/544,230, filed on Feb. 12, 2004.

(51) Int. Cl.
*H01S 3/06* (2006.01)
(52) U.S. Cl. .......................................... 372/67; 385/15
(58) Field of Classification Search .................. 372/35, 372/33, 72, 67, 69; 359/345
See application file for complete search history.

(56) References Cited

U.S. PATENT DOCUMENTS

| | | | |
|---|---|---|---|
| 5,723,856 A | 3/1998 | Yao et al. | |
| 5,777,778 A * | 7/1998 | Yao ............................. | 359/245 |
| 5,917,179 A | 6/1999 | Yao | |
| 5,929,430 A | 7/1999 | Yao et al. | |
| 6,138,076 A | 10/2000 | Yao | |
| 6,389,197 B1 | 5/2002 | Iltchenko et al. | |
| 6,417,957 B1 | 7/2002 | Yao | |
| 6,473,218 B1 | 10/2002 | Maleki et al. | |
| 6,476,959 B2 | 11/2002 | Yao | |
| 6,487,233 B2 | 11/2002 | Maleki et al. | |
| 6,488,861 B2 | 12/2002 | Iltchenko et al. | |
| 6,490,039 B2 | 12/2002 | Maleki et al. | |
| 6,535,328 B2 | 3/2003 | Yao | |
| 6,567,436 B1 | 5/2003 | Yao et al. | |
| 6,580,532 B1 | 6/2003 | Yao et al. | |
| 6,594,061 B2 | 7/2003 | Huang et al. | |
| 6,762,869 B2 | 7/2004 | Maleki et al. | |
| 6,901,189 B1 * | 5/2005 | Savchenkov et al. ......... | 385/39 |
| 6,987,914 B2 * | 1/2006 | Savchenkov et al. ......... | 385/50 |
| 7,043,117 B2 * | 5/2006 | Matsko et al. ................ | 385/28 |
| 2002/0018611 A1 | 2/2002 | Maleki et al. | |
| 2003/0012504 A1 | 1/2003 | Iltchenko | |

FOREIGN PATENT DOCUMENTS

WO    WO0196936    12/2001

OTHER PUBLICATIONS

L.E. Myers, et al.; Quasi-phase-matched optical parametric oscillators in bulk periodically poled LiNbO$_3$; Nov. 1995; J.Opt. Soc. Am. B/vol. 12, No. 11; pps. 2102-2116.

* cited by examiner

*Primary Examiner*—Minsun Oh Harvey
*Assistant Examiner*—Tuan N. Nguyen
(74) *Attorney, Agent, or Firm*—Fish & Richardson P.C.

(57) ABSTRACT

Coupled opto-electronic oscillators with a whispering-gallery-mode (WGM) optical resonator inside the laser cavity to produce oscillation signals out of the optical spectral range, e.g., RF or microwave frequencies.

17 Claims, 3 Drawing Sheets

COUPLED OPTO-ELECTRONIC OSCILLATORS WITH LOW NOISE

This application claims the benefit of U.S. Provisional Patent Application Ser. No. 60/544,230 entitled "Coupled opto-electronic oscillator with improved noise floor" and filed Feb. 12, 2004, the entire disclosure of which is incorporated herein by reference as part of the specification of this application.

BACKGROUND

This application relates to signal oscillators.

Signal oscillators may be constructed by using both electronic and optical components to form opto-electronic oscillators (OEOs). See, e.g., U.S. Pat. Nos. 5,723,856 and 5,777,778, which are incorporated herein by reference as part of the specification of this application. Such an OEO may include an electrically controllable optical modulator and at least one active opto-electronic feedback loop that includes an optical part and an electrical part interconnected by a photodetector. The opto-electronic feedback loop receives the modulated optical output from the modulator and converted it into an electrical signal to control the modulator. The loop produces a desired delay and feeds the electrical signal in phase to the modulator to generate and sustain both optical modulation and electrical oscillations outside the optical in, e.g., the microwave or radio frequency spectral range when the total loop gain of the active opto-electronic loop and any other additional feedback loops exceeds the total loss. The generated oscillating signals may be tunable in frequency and can have narrow spectral linewidths and low phase noise in comparison with the signals produced by other RF and microwaves oscillators. Notably, the OEOs are optical and electronic hybrid devices.

An OEO may be configured as a coupled opto-electronic oscillator (COEO) which directly couples a laser oscillation in an optical feedback loop (e.g., a laser cavity) to an electrical oscillation in an opto-electronic feedback loop. See, e.g., U.S. Pat. Nos. 5,929,430 and 6,567,436, which are incorporated herein by reference as part of the specification of this application. An optical resonator may be used in an optical section in which the optical feedback loop and the opto-electronic feedback loop overlap. The optical resonator may be an optical whispering-gallery-mode ("WGM") resonator which supports a special set of resonator modes known as whispering gallery ("WG") modes. These WG modes represent optical fields confined in an interior region close to the surface of the resonator due to the total internal reflection at the boundary. Optical WGM resonators with high quality factors have been demonstrated at Q values greater than $10^9$. Such hi-Q WGM resonators may be used to produce oscillation signals with high spectral purity and low noise.

SUMMARY

This application describes implementations of COEO devices with a WGM resonator inside the laser cavity to produce oscillation signals out of the optical spectral range, e.g., RF or microwave frequencies.

DETAILED DESCRIPTION

Implementations of coupled OEO devices described in this application use a high gain optical amplifier at one end of the laser cavity to boost the optical gain and an optical whispering gallery mode (WGM) resonator in the laser cavity to filter the light inside the laser cavity. In one implementation, the laser cavity includes a first semiconductor optical amplifier forming a first end of the laser cavity, a second semiconductor optical amplifier, and an electro-absorption modulator which forms a second end of the laser cavity. The modulator is integrated to the second semiconductor optical amplifier and modulates light in the laser cavity in response to a modulation signal. The optical whispering gallery mode resonator for this COEO implementation is located inside the laser cavity between the first and the second semiconductor amplifiers. A beam splitter inside the laser cavity is used to split a portion of the light in the laser cavity to produce an optical output and a photodetector is used to receive the optical output and to convert the optical output into a detector output. A circuit is further used to receive the detector output and to produce the modulation signal from the detector output. In this implementation, the beam splitter, the photodetector, the circuit, and the laser cavity forms an opto-electronic loop to support an oscillation at a frequency of the modulation of light.

Figure 1:
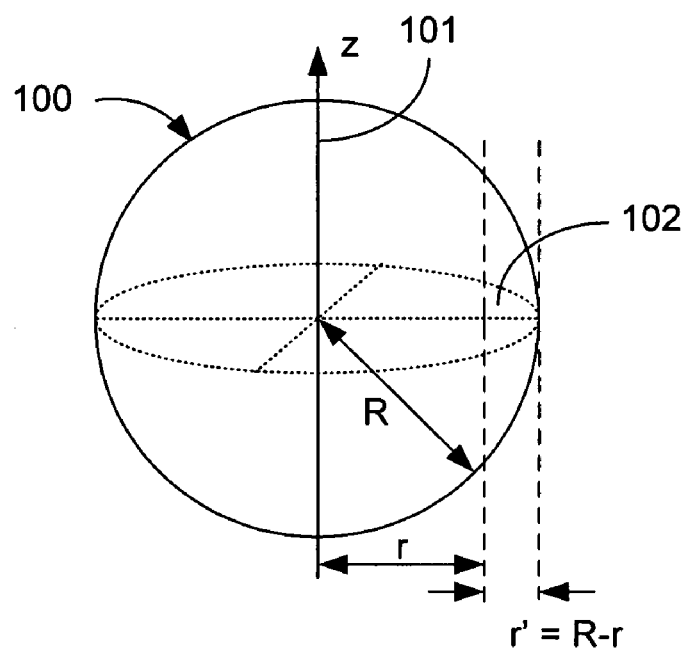
FIGS. 1, 2, 3, 4A, and 4B illustrate various exemplary resonator configurations that support whispering gallery modes.
Figure 2:
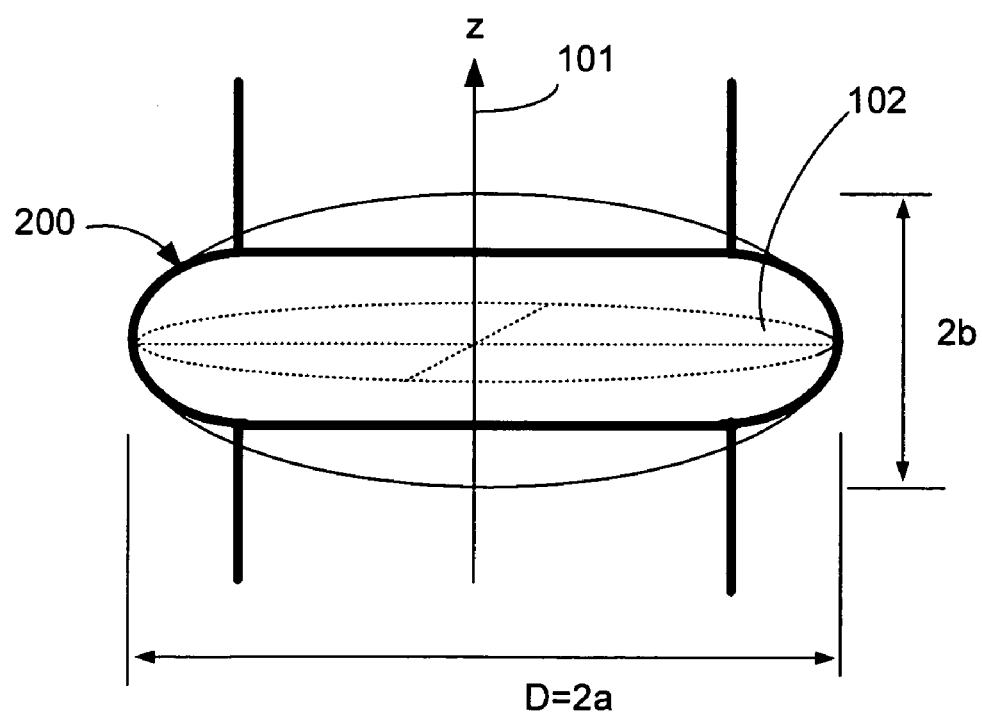
Figure 3:
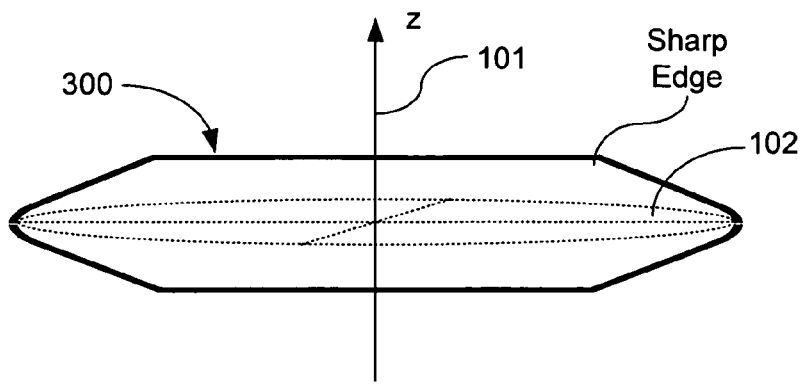

The following sections first describe the exemplary geometries of the WGM resonators that may be used in COEO devices. FIGS. 1, 2, and 3 illustrate three exemplary WGM resonators.

FIG. 1 shows a spherical WGM resonator 100 which is a solid dielectric sphere. The sphere 100 has an equator in the plane 102 which is symmetric around the z axis 101. The circumference of the plane 102 is a circle and the plane 102 is a circular cross section. A WG mode exists around the equator within the spherical exterior surface and circulates within the resonator 100. The spherical curvature of the exterior surface around the equator plane 102 provides spatial confinement along both the z direction and its perpendicular direction to support the WG modes. The eccentricity of the sphere 100 generally is low.

FIG. 2 shows an exemplary spheriodal microresonator 200. This resonator 200 may be formed by revolving an ellipse (with axial lengths a and b) around the symmetric axis along the short elliptical axis 101 (z). Therefore, similar to the spherical resonator in FIG. 1, the plane 102 in FIG. 2 also has a circular circumference and is a circular cross section. Different from the design in FIG. 1, the plane 102 in FIG. 2 is a circular cross section of the non-spherical spheroid and around the short ellipsoid axis of the spheroid. The eccentricity of resonator 100 is $(1-b^2/a^2)^{1/2}$ and is generally high, e.g., greater than $10^{-1}$. Hence, the exterior surface is the resonator 200 is not part of a sphere and provides more spatial confinement on the modes along the z direction than a spherical exterior. More specifically, the geometry of the cavity in the plane in which Z lies such as the zy or zx plane is elliptical. The equator plane 102 at the center of the resonator 200 is perpendicular to the axis 101 (z) and the WG modes circulate near the circumference of the plane 102 within the resonator 200.

FIG. 3 shows another exemplary WGM resonator 300 which has a non-spherical exterior where the exterior profile is a general conic shape which can be mathematically represented by a quadratic equation of the Cartesian coordinates. Similar to the geometries in FIGS. 1 and 2, the exterior surface provides curvatures in both the direction in the plane 102 and the direction of z perpendicular to the plane 102 to confine and support the WG modes. Such a non-spherical, non-elliptical surface may be, among others, a parabola or hyperbola. Note that the plane 102 in FIG. 3 is a circular cross section and a WG mode circulates around the circle in the equator.

The above three exemplary geometries in FIGS. 1, 2, and 3 share a common geometrical feature that they are all axially or cylindrically symmetric around the axis 101 (z) around which the WG modes circulate in the plane 102. The curved exterior surface is smooth around the plane 102 and provides two-dimensional confinement around the plane 102 to support the WG modes.

Notably, the spatial extent of the WG modes in each resonator along the z direction 101 is limited above and below the plane 102 and hence it may not be necessary to have the entirety of the sphere 100, the spheroid 200, or the conical shape 300. Instead, only a portion of the entire shape around the plane 102 that is sufficiently large to support the whispering gallery modes may be used to form the WGM resonator. For example, rings, disks and other geometries formed from a proper section of a sphere may be used as a spherical WGM resonator.

Figure 4A:
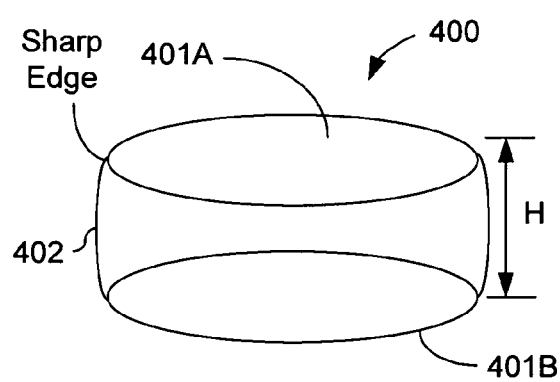
Figure 4B:
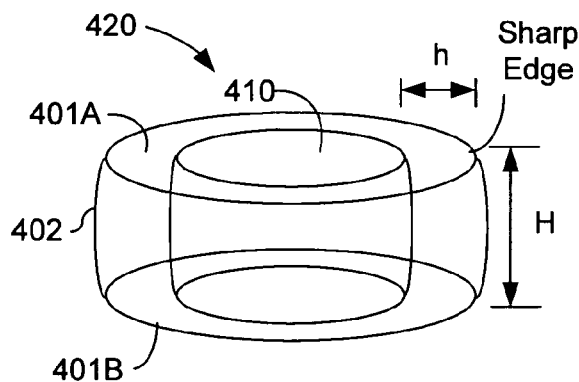

FIGS. 4A and 4B show a disk-shaped WGM resonator 400 and a ring-shaped WGM resonator 420, respectively. In FIG. 4A, the solid disk 400 has a top surface 401A above the center plane 102 and a bottom surface 401B below the plane 102 with a distance H. The value of the distance H is sufficiently large to support the WG modes. Beyond this sufficient distance above the center plane 102, the resonator may have sharp edges as illustrated in FIGS. 3, 4A, and 4B. The exterior curved surface 402 can be selected from any of the shapes shown in FIGS. 1, 2, and 3 to achieve desired WG modes and spectral properties. The ring resonator 420 in FIG. 4B may be formed by removing a center portion 410 from the solid disk 400 in FIG. 4A. Since the WG modes are present near the exterior part of the ring 420 near the exterior surface 402, the thickness h of the ring may be set to be sufficiently large to support the WG modes.

Figure 5A:
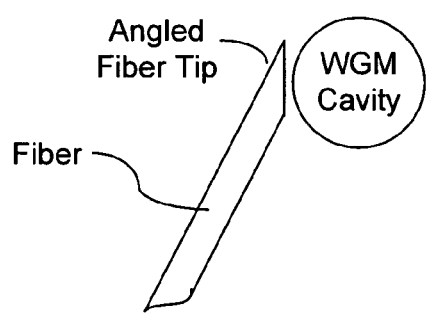
FIGS. 5A and 5B illustrate two evanescent coupling examples.
Figure 5B:
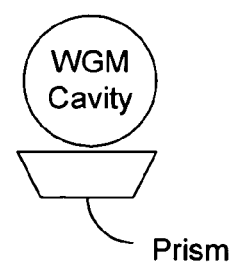

An optical coupler is generally used to couple optical energy into or out of the WGM resonator by evanescent coupling. FIGS. 5A and 5B show two exemplary optical couplers engaged to a WGM resonator. The optical coupler may be in direct contact with or separated by a gap from the exterior surface of the resonator to effectuate the desired critical coupling. FIG. 5A shows an angle-polished fiber tip as a coupler for the WGM resonator. A waveguide with an angled end facet, such as a planar waveguide or other waveguide, may also be used as the coupler. FIG. 5B shows a micro prism as a coupler for the WGM resonator. Other evanescent couplers may also be used, such as a coupler formed from a photonic bandgap material.

In WGM resonators with uniform indices, a part of the electromagnetic field of the WG modes is located at the exterior surface of the resonators. A gap between the optical coupler and the WGM resonator with a uniform index is generally needed to achieve a proper optical coupling. This gap is used to properly "unload" the WG mode. The Q-factor of a WG mode is determined by properties of the dielectric material of the WGM resonator, the shape of the resonator, the external conditions, and strength of the coupling through the coupler (e.g. prism). The highest Q-factor may be achieved when all the parameters are properly balanced to achieve a critical coupling condition. In WGM resonators with uniform indices, if the coupler such as a prism touches the exterior surface of the resonator, the coupling is strong and this loading can render the Q factor to be small. Hence, the gap between the surface and the coupler is used to reduce the coupling and to increase the Q factor. In general, this gap is very small, e.g., less than one wavelength of the light to be coupled into a WG mode. Precise positioning devices such as piezo elements may be used to control and maintain this gap at a proper value.

High Q WGM resonators with proper input and output optical couplers may be used to perform as ultra narrow bandpass optical filters inside the laser cavities of COEO devices to filter out optical noise such as noise caused by the amplified spontaneous emission (ASE). Such intracavity WGM resonator and the laser cavity are designed to be matched in their optical modes. In addition, as described in U.S. Pat. No. 6,567,436, the opto-electronic loop is configured to meet proper mode matching conditions. Notably, the presence of the WGM resonator inside the laser cavity changes the noise distribution inside the laser cavity. Light that transmits through the WGM resonator prior to interaction with an optical gain medium tends to have lower noise than light that emerges from an optical gain medium and propagates towards the WGM resonator. Hence, the optical signal to the optical portion of the opto-electronic loop may be selected from light that transmits through the WGM resonator prior to interaction with an optical gain medium in such COEO devices to reduce the noise in the opto-electronic loop and hence the generated oscillation signal.

Figure 6:
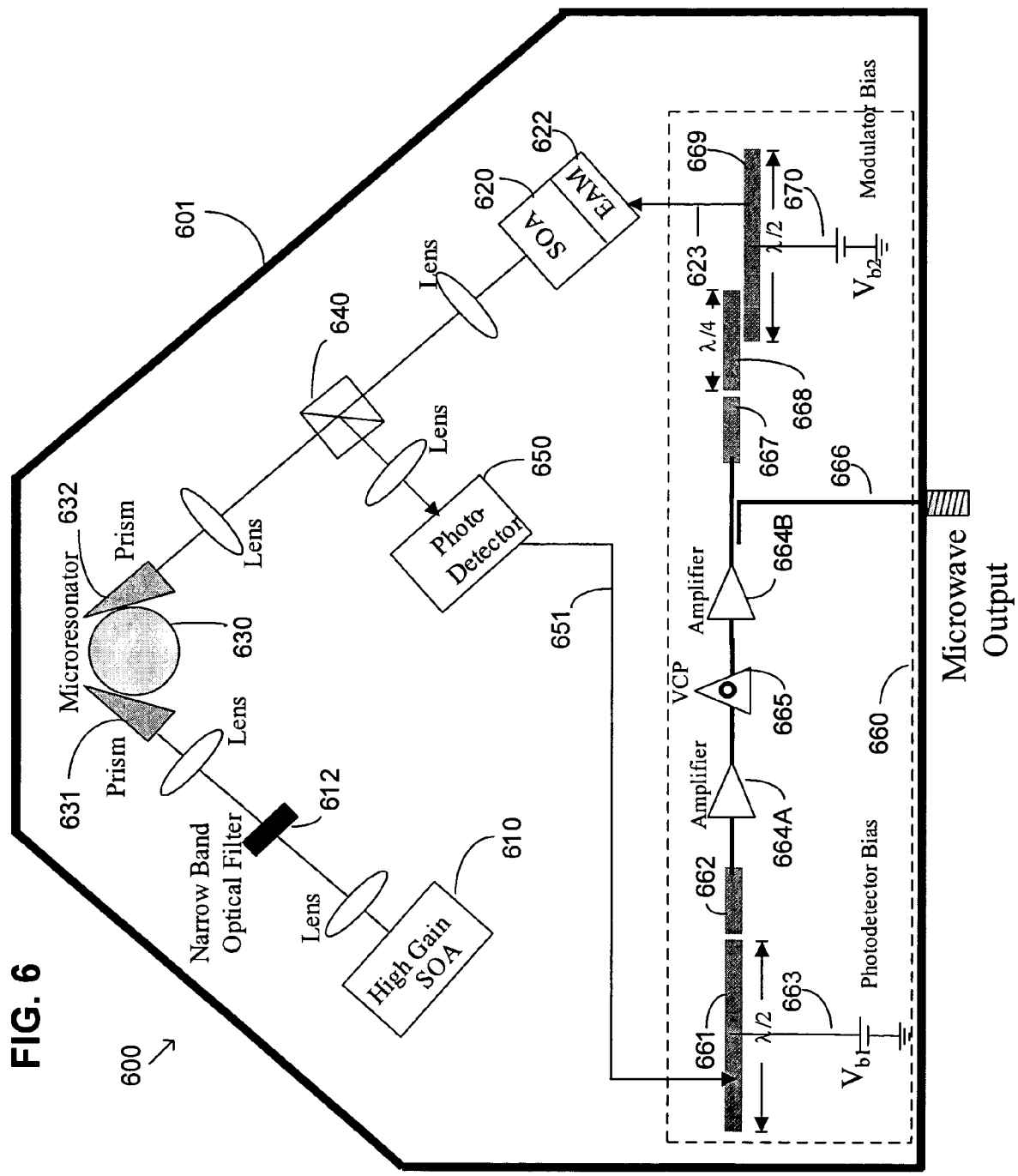
FIG. 6 shows an example of a coupled opto-electronic oscillator that has a WGM resonator inside the laser cavity.

FIG. 6 illustrates an example of a COEO 600 with an intracavity WGM resonator 630. The entire COEO 600 may be placed on a base 601 and is enclosed in a housing. The optical path between optical components may be in free space. Alternatively, optical waveguides such as fibers or waveguides formed on substrates may be used. The laser cavity in the COEO 600 is formed by a first optical gain medium 610 on one side of the WGM resonator 630 as the first end of the laser cavity, and a second optical gain medium 620 and an optical modulator 622 on the other side of the WGM resonator 630 as the second end of the laser cavity. Hence, light inside the laser cavity is reflected between the first optical gain medium 610 and the optical modulator 622 is amplified by the gain media 610 and 620 to sustain a laser oscillation. The light is optically filtered by the WGM resonator 630 and is modulated by the optical modulator 622 in response to a modulation signal 623 that is applied to control the modulation by the modulator 622. An optical beam splitter 640, e.g., an optical beam splitting cube, is placed inside the laser cavity to split a portion of the light generated inside the laser cavity to the optical portion of the opto-electronic loop of the COEO 600. The beam splitter 640 or another optical beam splitter may be used to generate another optical output as the optical output of the COEO 600. For example, a beam splitting cube may be placed between the gain medium 610 and the WGM resonator 630 to split a portion of the beam propagating from the WGM resonator 630 towards the gain medium 610 as the optical output of the COEO 600.

The opto-electronic loop of the COEO 600 includes the beam splitter 640, a photodetector 650, a circuit 660, and the laser cavity as a closed loop to support an oscillation at a frequency of the modulation of light. An electrical link 651 is used to connect the photodetector 650 and the circuit 650 to direct the detector output to the circuit 650. Another electrical link 623 is used to connect the modulator 622 and the circuit 660 to provide the modulation signal to the modulator 622. The circuit 660 may include a signal amplifier (e.g., 664A and 664B) which amplifies the signal received from the photodetector 650, and a voltage controlled phase shifter 665 which adjusts the phase of the modulation signal at the modulator 622. The modulation signal from the circuit 660 at the modulator 622 is in phase to generate and sustain the oscillation and is different from a negative feedback loop where the feedback signal is out of phase with the modulation to avoid any oscillation.

The optical gain media 610 and 620 on two sides of the WGM resonator 630 may be designed to have different optical gains. For example, the gain of the medium 610 may be higher than that of the medium 620. Under this configuration, the light in the laser cavity leaving the first gain medium has just passed through the gain medium 610 twice and thus is strongly amplified by the first gain medium 610. The WGM resonator 630 subsequently filters the amplified light to remove light at frequencies outside the resonant frequency of the WGM resonator. This filtering removes various noise signals in the light including the noise caused by ASE in the optical gain media. Accordingly, with a sufficient gain in the medium 610, the light coming out of the WGM resonator 630 towards the second gain medium 620 has more power and less noise than other light beams in the laser cavity. Hence, a portion of this light coming out of the WGM resonator 630 towards the second gain medium 620 may be directed out of the laser cavity to the optical portion of the opto-electronic loop. Therefore, under this configuration, the optical beam splitter 640 may be placed between the WGM resonator 630 and the second optical gain medium 620 to split light in the laser cavity that travels from the first gain medium 610 towards the second gain medium 620 as the optical output to the photodetector 650.

The first optical gain medium 610 may be a semiconductor optical amplifier (SOA) with a high optical gain, e.g., 15 to 30 dB. The SOA 610 may also be designed to have a high saturation power, e.g., in the range from 16 dBm to 20 dBm. The second gain medium 620 and the modulator 622 may be a second semiconductor optical amplifier and an electro-absorption modulator, respectively. This second semiconductor optical amplifier and the electro-absorption modulator may be an integrated semiconductor device. The optical gain of the second SOA 620 is less than the first SOA 610, e.g., may be at 15 dB or less and its saturation power may also be less than that of the first SOA 610, e.g., in a range from 8 dBm to 12 dBm.

The COEO 600 may also include a narrow band optical filter 612 between the first gain medium 610 and the WGM resonator 630 provide additional optical filtering to further suppress any optical noise. A first optical coupler 631 is located between the first gain medium 610 and the optical whispering gallery mode resonator 630 to couple light into and out of the optical whispering gallery mode resonator 630. A second optical coupler 632 is located between the second gain medium 620 and the optical whispering gallery mode resonator 630 to couple light into and out of the optical whispering gallery mode resonator 630. The couplers 631 and 632 may be prisms or other optical coupling devices. In addition, optical lenses may be placed at selected locations inside the laser cavity to collimate and focus the light. A lens may be placed between the beam splitter 640 and the photodetector 650 to direct the light into the sensing area of the photodetector 650.

The circuit 660 in the electrical portion of the opto-electronic loop may include a photodetector bias circuit 663 which provides an electrical bias to the photodetector 650 via the link 651. The circuit 660 may also include a modulator bias circuit 670 which provides an electrical bias to the electro-absorption modulator 622. A planar electrode strip 661 may be used at the input of the circuit 660 to receive the detector signal from the photodetector in an impedance-matched condition. As illustrated a $\lambda/2$ resonance line is used as the strip 661, where $\lambda$ is the wavelength of the oscillation signal in the detector output in, e.g., an RF or microwave frequency. A feed line 662, separate from the line 661, is used to deliver the received signal to the rest of the circuit 660. At the output of the circuit 660, a planar electrode strip 669, e.g., a $\lambda/2$ resonance line, may be used to output the modulation signal to the modulator 622 in an impedance-matched condition. An receiving electrode 667 delivers the modulation signal to a $\lambda/4$ resonance line 668 which is coupled to the electrode 669. Various designs may be used to provide impedance-matching conditions at the input and output of the circuit 660. A signal coupler may be used in the circuit 660 to generate an output for the RF or microwave signal.

Only a few implementations are disclosed. However, it is understood that variations and enhancements may be made.

What is claimed is:

1. A device, comprising:
 a laser cavity comprising a first semiconductor optical amplifier forming a first end of the laser cavity, a second semiconductor optical amplifier, and an electro-absorption modulator which forms a second end of the laser cavity and is integrated to the second semiconductor optical amplifier, wherein the electro-absorption modulator modulates light in the laser cavity in response to a modulation signal;
 an optical whispering gallery mode resonator located inside the laser cavity between the first and the second semiconductor amplifiers to filter light in the laser cavity;
 a beam splitter inside the laser cavity to split a portion of the light in the laser cavity to produce an optical output;
 a photodetector to receive the optical output and to convert the optical output into a detector output; and
 a circuit to receive the detector output and to produce the modulation signal from the detector output,
 wherein the beam splitter, the photodetector, the circuit, and the laser cavity forms an opto-electronic loop to support an oscillation at a frequency of the modulation of light.

2. A device as in claim 1, wherein the beam splitter is located between the optical whispering gallery mode resonator and the second semiconductor optical amplifier.

3. A device as in claim 2, wherein the beam splitter splits light in the laser cavity that travels from the first semiconductor optical amplifier towards the second semiconductor optical amplifier as the optical output to the photodetector.

4. A device as in claim 3, further comprising an optical filter located between the first semiconductor optical amplifier and the optical whispering gallery mode resonator to filter the light in the laser cavity.

5. A device as in claim 1, further comprising:
 a first optical coupler located between the first semiconductor optical amplifier and the optical whispering gallery mode resonator to couple light into and out of the optical whispering gallery mode resonator; and
 a second optical coupler located between the second semiconductor optical amplifier and the optical whispering gallery mode resonator to couple light into and out of the optical whispering gallery mode resonator.

6. A device as in claim 1, wherein the circuit comprises a photodetector bias circuit which provides an electrical bias to the photodetector.

7. A device as in claim 1, wherein the circuit comprises a modulator bias circuit which provides an electrical bias to the electro-absorption modulator.

8. A device as in claim 1, wherein the circuit comprises an amplifier.

9. A device as in claim 1, wherein the circuit comprises a voltage-controlled phase shifter which adjusts a phase of the modulation signal to the electro-absorption modulator.

10. A device as in claim 1, wherein the first semiconductor optical amplifier has a gain from 15 dB to 30 dB.

11. A device as in claim 1, wherein the optical whispering gallery mode resonator comprises at least a portion of a sphere.

12. A device as in claim 1, wherein the optical whispering gallery mode resonator is a disk.

13. A device as in claim 1, wherein the optical whispering gallery mode resonator is a non-spherical resonator.

14. A device as in claim 1, wherein the first semiconductor optical amplifier has an optical grain greater than an optical gain of the second semiconductor optical amplifier.

15. A device, comprising:
   a first optical gain medium, an optical whispering gallery mode resonator, a second optical gain medium, and an optical modulator sequentially arranged relative to one another to define an optical path and to form a laser which produces laser light that is confined between the first optical gain medium and the optical modulator, wherein the optical modulator modulates the laser light in response to a modulation signal;
   a beam splitter located between the optical whispering gallery mode resonator and the second optical gain medium to split a portion of the laser light propagating from the optical whispering gallery mode resonator to the second optical gain medium;
   a photodetector outside the laser to receive light from the beam splitter and to produce a detector output; and
   a circuit to receive the detector output and to produce the modulation signal from the detector output,
   wherein the laser, the beam splitter, the photodetector, and the circuit form a closed opto-electronic loop which oscillates at a frequency at which the optical modulator modulates the laser light.

16. A device as in claim 15, wherein the first optical gain medium has an optical gain greater than an optical gain of the second optical gain medium.

17. A device as in claim 15, wherein the optical path is in free space.

* * * * *